(12) United States Patent
Goerlach

(10) Patent No.: US 10,431,653 B2
(45) Date of Patent: Oct. 1, 2019

(54) TRENCH-BASED DIODE AND METHOD FOR MANUFACTURING SUCH A DIODE

(71) Applicant: Robert Bosch GmbH, Stuttgart (DE)

(72) Inventor: Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 31 days.

(21) Appl. No.: 15/450,168

(22) Filed: Mar. 6, 2017

(65) Prior Publication Data

US 2017/0271444 A1    Sep. 21, 2017

(30) Foreign Application Priority Data

Mar. 15, 2016   (DE) .......................... 10 2016 204 250

(51) Int. Cl.

| H01L 29/06 | (2006.01) |
|---|---|
| H01L 29/861 | (2006.01) |
| H01L 29/47 | (2006.01) |
| H01L 29/16 | (2006.01) |
| H01L 29/66 | (2006.01) |
| H01L 21/02 | (2006.01) |

(52) U.S. Cl.
CPC .... *H01L 29/0688* (2013.01); *H01L 21/02532* (2013.01); *H01L 21/02595* (2013.01); *H01L 29/1608* (2013.01); *H01L 29/47* (2013.01); *H01L 29/66136* (2013.01); *H01L 29/861* (2013.01)

(58) Field of Classification Search
CPC ... H01L 29/0688; H01L 29/861; H01L 29/47; H01L 29/66136; H01L 21/02532; H01L 21/02595; H01L 21/047; H01L 29/1058; H01L 29/1066; H01L 29/1608; H01L 29/66068; H01L 29/8083; H01L 29/2003; H01L 29/7722

USPC .... 257/77, E29.082, 262, E29.059, E29.243
See application file for complete search history.

(56) References Cited

U.S. PATENT DOCUMENTS

| 8,198,687 B2 | 6/2012 | Rinehimer | |
|---|---|---|---|
| 8,722,292 B2 | 5/2014 | Seitoku | |
| 2003/0201455 A1* | 10/2003 | Takahashi | ........... H01L 29/0692 257/136 |
| 2004/0135178 A1* | 7/2004 | Onose | ................. H01L 29/1066 257/262 |

* cited by examiner

*Primary Examiner* — Mouloucoulaye Inoussa
(74) *Attorney, Agent, or Firm* — Norton Rose Fulbright US LLP; Gerard Messina

(57) ABSTRACT

A semiconductor system including a planar anode contact, a planar cathode contact, and a volume of n-conductive semiconductor material, which has an anode-side end and a cathode-side end and extends between the anode contact and the cathode contact. A p-conductive area extends from the anode-side end of the volume toward the cathode-side end of the volume without reaching the cathode-side end. The p-conductive area has two sub-areas which are separated from one another in a cross section lying transversely with respect to the anode contact and the cathode contact, which delimit a sub-volume of the volume filled with n-conductive semiconductor material. The sub-volume is open toward the cathode contact, and is delimited by cathode-side ends of the sub-areas. A distance of the two sub-areas defining the opening is smaller than a distance between the two sub-areas prevailing outside of the opening and lying between anode side ends of the sub-areas.

9 Claims, 5 Drawing Sheets

TRENCH-BASED DIODE AND METHOD FOR MANUFACTURING SUCH A DIODE

CROSS REFERENCE

The present application claims the benefit under 35 U.S.C. § 119 of German Patent Application No. DE 102016204250.5 filed on Mar. 15, 2016, which is expressly incorporated herein by reference in its entirety.

BACKGROUND INFORMATION

The present invention relates to a semiconductor system. A conventional semiconductor system includes a planar anode contact and a planar cathode contact and a first volume of n-conductive semiconductor material, which extends between the planar anode contact and the planar cathode contact. A direction pointing from the anode contact to the cathode contact defines a depth direction. The semiconductor system has at least one p-conductive area having an anode-side end and a cathode-side end and which extends from the anode-side end in the depth direction toward the cathode-side end without reaching the cathode-side end.

When alternating current or three-phase current is rectified, alternating current bridges (rectifiers) are used. Semiconductor diodes having a PN junction of silicon are mostly used as rectifying elements. In high-power systems, power semiconductor diodes, which are suitable for current densities of more than 500 A/cm$^2$ and high operating temperatures at depletion layer temperatures of Tj~225° C., are used. Typically, voltage drop UF is approximately 1 volt in the direction of flow (i.e., the forward voltage) at the high currents used. In systems which are designed for relatively low system voltages, which is the case, for example, in motor vehicle generator diodes, the maximum cutoff voltage of the diodes may be additionally limited. These diodes may be operated at high currents in cutoff voltage breakdown, at least for short times. This may be used to limit the system voltage or vehicle electrical system voltage. Frequently, a voltage limitation in the range of 20-50 volts is needed.

The forward voltage of PN diodes results in conducting-state power losses and thus in an efficiency degradation of the system, for example, a generator. The conducting-state power losses result in undesirable heating of the components, which must be counteracted by complex measures for dissipating heat from the rectifier to the surroundings using heat sinks and/or fans.

For reducing the conducting-state power losses, other components such as improved Schottky diodes, pseudo-Schottky rectifiers, etc., or actively controlled power transistors are increasingly provided. German Patent Application No. DE 10 2004 056 663 A1 describes in this connection a trench MOS barrier Schottky diode including an integrated PN diode.

The existing approaches are either relatively complex, as in the case of actively controlled power transistors, and/or they are difficult to integrate into a single housing, for example, into a press-fit diode housing for motor vehicle generators, or they have only a limited effect. Thus, in the case of pure diode approaches, it has hitherto not been possible to overcome the correlation between forward voltage and the cutoff currents. The smaller the forward voltage, the higher the cutoff currents.

SUMMARY

In accordance with the present invention, in a cross section lying transverse to the anode contact and the cathode contact, the p-conductive area has two sub-areas, which are separated from one another, which delimit a sub-volume of the first volume filled with the n-conductive semiconductor material, the sub-volume filled with the semiconductor material being open toward the cathode, the opening being delimited by cathode-side ends of the sub-areas, and a distance of the two sub-areas defining the opening being smaller than a distance between the two sub-areas prevailing outside of the opening and lying between the anode-side end of the sub-areas. The opening therefore constitutes a constriction in the current path of n-conductive material between the anode and the cathode.

The present invention makes it possible to reduce the unsatisfactory correlation between the cutoff current and the forward voltage. The diode according to the present invention may have very small resistance in the flow direction, associated with low losses and a resulting very high efficiency. In addition, it has a low cutoff current. The diodes according to the present invention may also be used for voltage limitation. The power semiconductor diode according to the present invention may also be packaged in a press-fit diode housing and used for efficient rectification in motor vehicle AC generators.

Additional advantages are described below with reference to the figures.

It is understood that the features stated above and the features explained below are usable not only in the particular combination specified but also in other combinations or alone without departing from the scope of the present invention.

Exemplary embodiments of the present invention are depicted in the figures and are explained in greater detail below. Identical reference numerals in different figures denote elements which are identical or are at least comparable based on their function.

DETAILED DESCRIPTION OF EXAMPLE EMBODIMENTS

Figure 1:
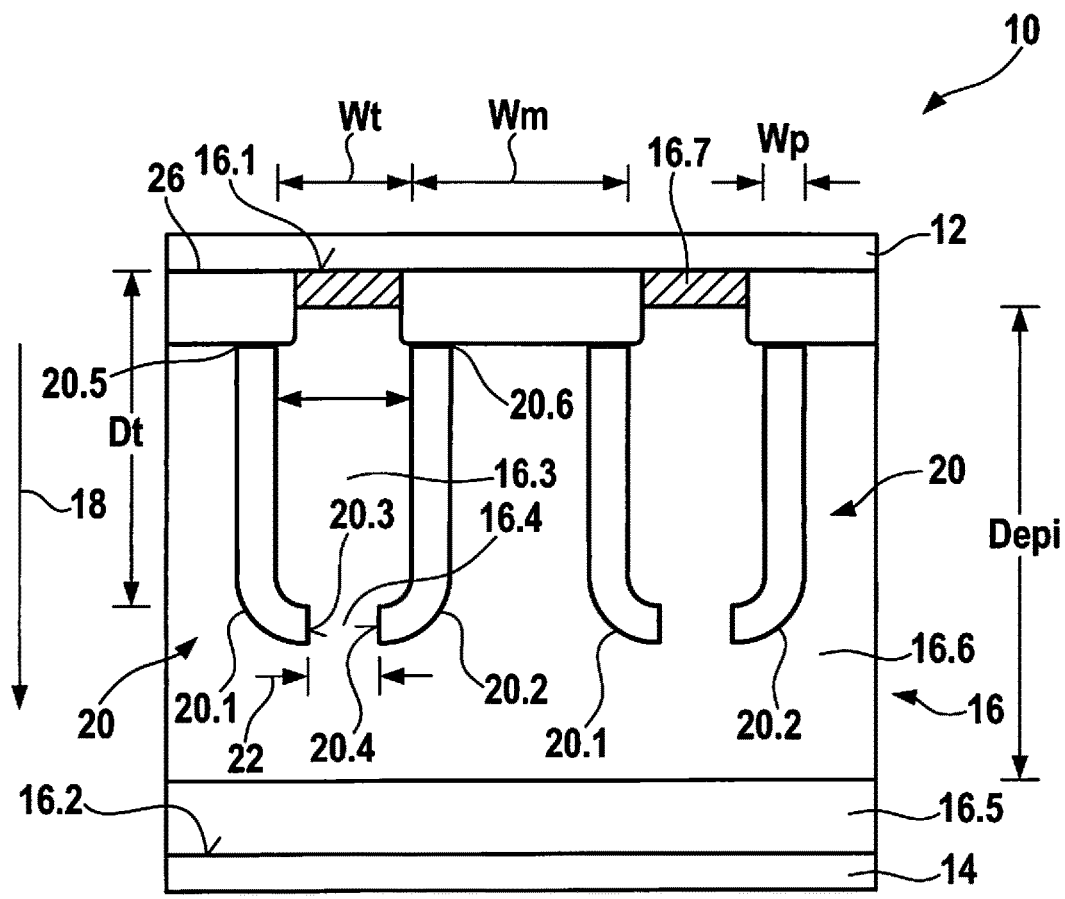
FIG. 1 schematically shows a first exemplary embodiment of a semiconductor system according to the present invention.

In detail, FIG. 1 shows a semiconductor system 10 including a planar anode contact 12 and a planar cathode contact 14, and a first volume 16 of n-conductive semiconductor material, which has an anode-side end 16.1 and a cathode-side end 16.2 and extends between planar anode contact 12 and planar cathode contact 14. A direction pointing from anode contact 12 to cathode contact 14 defines a depth direction 18. Semiconductor system 10 has at least one p-conductive area 20 extending from anode-side end 16.1 of first volume 16 in depth direction 18 toward cathode-side end 16.2 of first volume 16 without reaching cathode-side end 16.2 of first volume 16.

p-conductive area 20 has at least two sub-areas 20.1, 20.2, which are separated from one another, in a cross section lying transversely with respect to anode contact 12 and cathode contact 14, which delimit a first sub-volume 16.3 of first volume 16 filled with the n-conductive semiconductor material, first sub-volume 16. 3 filled by the semiconductor material being open toward cathode contact 14. The cross section lies in the drawing plane in FIG. 1. Opening 16.4 is delimited by cathode-side ends 20.3, 20.4 of sub-areas 20.1, 20.2. A distance of the two sub-areas 20.1, 20.2 defining opening 16.4 is smaller than a distance 24 between the two sub-areas 20.1, 20.2, which prevails outside of opening 16.4 and lies between anode-side ends 20.5, 20.6 of sub-areas 20.1, 20.2.

The anode side preferably forms a chip surface of semiconductor system 10. A second sub-volume of volume 16 of n-conductive material is a highly n+-doped silicon substrate layer 16.5. The plus sign represents a high dopant concentration. A less highly n-doped silicon layer (epi layer) 16.6 having a doping concentration Nepi and a thickness Depi is located on this layer 16.5, into which a plurality of strip-shaped or island-shaped, p-doped and thus p-conductive areas 20 of a depth Dt are introduced. Two each of the areas which face one another by facing ends 20.3, 20.4 extend in depth direction 18 largely at a distance Wt from one another.

Four p-doped areas 20.1, 20.2 are plotted in FIG. 1, of which the particular two left sub-areas and the two right sub-areas form a functionally coherent p-conductive area 20. Cathode-side ends 20.3, 20.4 form a bottom of a p-doped area 20. The bottom is preferably somewhat rounded by a rounded shape of ends 20.3, 20.4. Opening 16.4 is located in the bottom, so that cathode-side ends 20.3, 20.4 of p-doped sub-areas 20.1, 20.2 have a distance 22 from one another.

Thin p-doped areas 20 have a doping concentration NA and a thickness Wp. In the case of island-shaped areas, the thickness is a diameter of a columnar area 20. In the case of strip-shaped areas, the thickness is a wall thickness of sub-areas 20.1, 20.2. Such walls extend, for example, in a straight line perpendicular to the drawing plane of FIG. 1. The following description primarily relates to embodiments having strip-shaped areas.

Located diametrically opposed to openings 16.4 having width 22 are located highly n+-doped sub-volumes 16.7 of first volume 16 of n-conductive material between anode-side ends 20.5, 20.6 of p-conductive sub-areas 20.1, 20.2 on anode-side end 16.1 of first volume 16 of n-conductive material. One such sub-volume 16.7 each lies between two sub-areas 20.1, 20.2 of a p-conductive area 20.

Likewise, on anode-side end 16.1 of first volume 16 of n-conductive material, flat p-doped areas 26 adjoin highly n+-doped sub-volumes 16.7, of which one each lies between two highly n+-doped sub-volumes 16.7 and connects a second sub-area 20.2 of a first p-doped area 20 having two sub-areas 20.1, 20.2 to a first sub-area 20.1 of a second p-doped sub-area 20 which is adjacent to it and has two sub-areas 20.1, 20.2.

Flat, p-doped areas 26 preferably have a dopant concentration NA2. In this case, concentration NA2 is higher than concentration NA of p-doped areas 20. Planar anode contact 12, which is preferably implemented as a metal layer or metal layer stack, lies on the side of sub-volumes 16.7 and areas 26 facing away from the remaining semiconductor material of semiconductor system 10. Each of n-doped sub-volumes 16.7 as well as each of p-doped areas 26 forms an ohmic contact in each case together with anode contact 12. Cathode contact 14 situated on the chip rear side also forms an ohmic contact with highly n+-doped silicon substrate 16.5.

The illustrated semiconductor system has the following characteristics: If a positive voltage is applied to anode contact 12 (forward direction), current flows from anode contact 12 via highly n+-doped sub-volumes 16.7, sub-volumes 16.3, sub-volume 16.6 and high-resistance substrate 16.5 to cathode contact 14. The currents flow in particular through openings 16.4. Since only ohmic voltage drops occur, the voltage drop may in principle be arbitrarily small, in contrast to a diode. In the case of a positive voltage on the cathode (cutoff direction), on the other hand, a space charge region is formed between p-doped areas 20 and 26 on the one side and n-doped sub-volumes 16.3 and 16.6 adjacent to them. If the dimensions and dopings of the layers are suitably selected, the space charge regions, which emerge from individual p-doped areas 20.1, 20.2, and in particular from their cathode-side ends 20.3, 20.4, extend so far into the n-doped volume that a coherent space charge region is formed. This is the case, in particular, in openings 16.4, where cathode-side ends 20.3 and 20.4 have a small distance from one another.

Since in this case there is a continuous space charge region between cathode 14 and anode 12, no current flows, apart from a small cutoff current. Semiconductor system 10 blocks. In the case of a cutoff event, the locations of the highest field strength are located on the boundary surfaces of the PN junctions formed by the p-doped areas and the n-doped sub-volumes, namely in the area of openings 16.4 which are arranged on the bottom of p-doped areas 20, i.e., on cathode-side ends 20.3, 20.4 of sub-areas 20.1, 20.2 of p-doped areas 20. If the cutoff voltage is increased, the field strength is also increased until at these locations a current flow due to charge carrier generation occurs in the avalanche breakdown and a further voltage increase is limited (breakdown voltage).

Consequently, the semiconductor system advantageously has a voltage-limiting clamping function. The voltage applied to the component in the cutoff case is limited to the value of the breakdown voltage. The value of the breakdown voltage may be influenced by a change in the geometry of the semiconductor system during its design. The breakdown voltage depends in particular on the dimensions of the structures in the direction parallel to the chip surface, which is perpendicular to depth direction 18 and is located in the drawing plane in FIG. 1 and may be very small.

Wall thickness Wp of p-doped areas 20 and the width of opening 16.4 are preferably only 100-400 nanometers. It is also preferred that depth Dt of p-doped areas 20 in depth direction 18 is greater than 1 micrometer and in particular is preferably between 2 micrometers and 4 micrometers.

Fine and deep sub-areas 20.1, 20.2 of p-doped structures 20 of FIG. 1 may be manufactured in a homogeneous epitaxial layer 16 using conventional methods only by involving a very high complexity or not at all. For manufacturing the structures shown in FIG. 1, a process sequence is therefore provided in which, after an epitaxial growth of n-doped first volume 16, sub-volume 16.3 of this layer (or of this volume) is removed on a width 24 between p-doped sub-areas 20.1, 20.2 (not yet present). Subsequently, p-doped areas 20 are produced by p-doping the side walls. Initially empty volume 16.3 is filled with n-doped polysilicon which has the same or at least a very similar doping concentration as the rest of volume 16 of n-conductive semiconductor material.

FIG. 1 shows in particular a semiconductor system 10 including an anode contact 12 and a cathode contact 14, which is characterized by a low forward voltage and has an integrated clamping element for limiting the cutoff voltage. The semiconductor system has an n-doped epitaxial semiconductor layer 16, which is located on a very highly n-doped semiconductor layer 16.5, the latter extending over a contact layer used as cathode contact 14. Semiconductor system 10 has several closely spaced thin, deep, columnar or strip-shaped p-doped areas 20, which have a minimum distance on their cathode-side end, so that a constriction occurs there. In particular, areas 20 have a smaller distance 16.4 from one another than on their anode-side end. Areas 20 extend from the anode side of the semiconductor system into the depth of epitaxial semiconductor layer 16. On the anode-side ends of p-doped areas 20, which are diametrically opposed to the locations of the closest distance, ohmic contacts having anode contact layer 12 are created. To form the ohmic contacts, in one embodiment, flat, p-doped areas 26 are situated between areas 20 and the anode contact, which are more highly doped than areas 20. The anode-side end of n-doped layer 16 is provided with an n-doped layer 16.7, which is more highly doped and forms an ohmic contact with anode contact 12.

Figure 2:
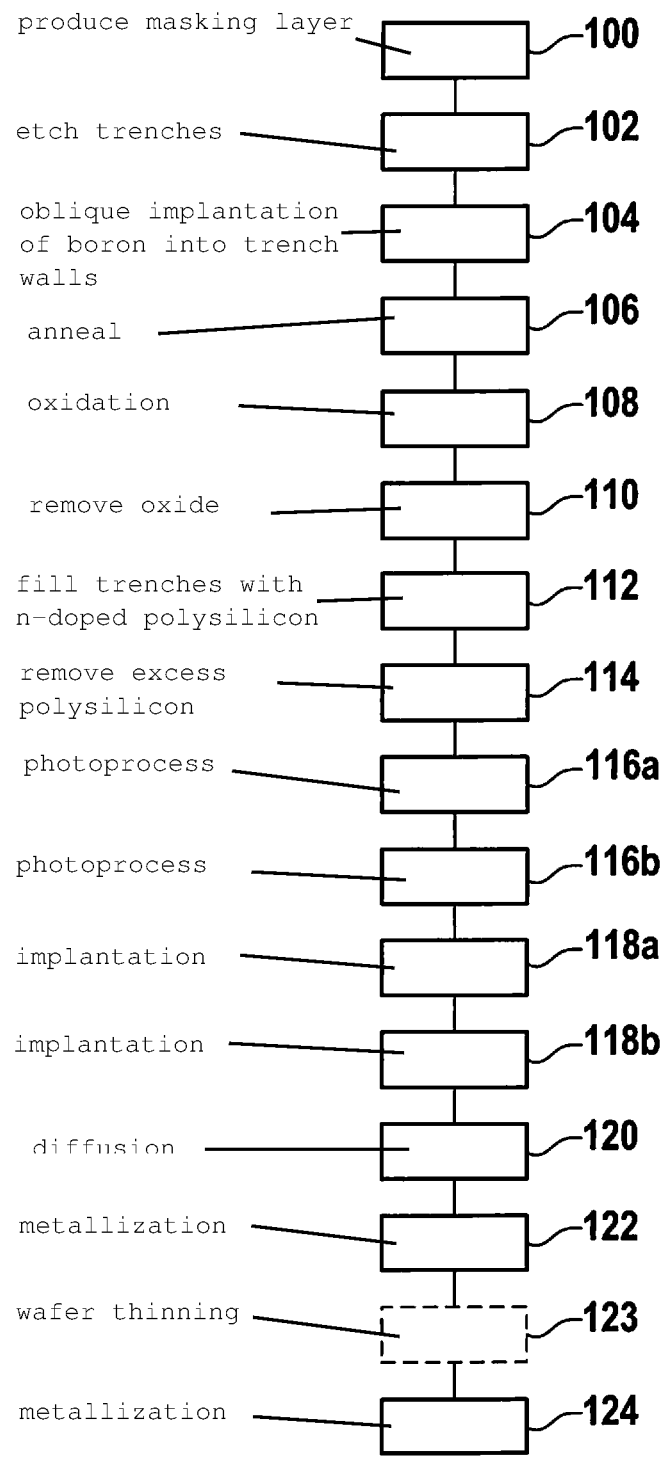
FIG. 2 schematically shows a flow chart as an exemplary embodiment of a method for manufacturing such a semiconductor system.

FIG. 2 shows a flow chart as an exemplary embodiment of a method for manufacturing such a diode. A first volume 16 of semiconductor material of thickness Depi is used as the base material. In detail, a masking layer is initially produced in a photolithographic process step 100. Subsequently, in a step 102, trenches of a depth Dt and a width 24 are etched in silicon. The pitch is Wt+Wm. The pitch forms the width of an elementary cell of the semiconductor system. The semiconductor system is preferably made up of a plurality of such elementary cells. This is followed in a step 104 by an oblique implantation of boron into the trench walls, central parts of the trench floor being excluded by the oblique implantation direction, resulting in openings 16.4. Thereafter, a short annealing takes place in a step 106 and a short oxidation of the trench surface occurs in a step 108. The resulting oxide is removed in a subsequent step 110. The trenches are then filled with n-doped polysilicon in a step 112. Excess polysilicon is removed in a step 114 by back etching or chemical mechanical polishing (CMP).

Highly n-doped sub-volumes 16.7 and highly p-doped sub-areas 26 are produced by photoprocess steps 116a and 116b and implantations taking place in steps 118a and 118b. Subsequently, a diffusion step 120 takes place so that p-doped sub-areas 20.1, 20.2 spread to approximately a diffusion-induced penetration depth Wp into n-epitaxial area 16 and leave opening 16.4 open on the bottom. In the diffusion step which takes place by heat treatment, n-conductive sub-volumes 16.7 and p-conductive sub-areas 26 are electrically activated parallel to the diffusion. This is followed by a metallization of the front side for producing anode contact 12 in a metallization step 122 and a metallization of the rear side for producing cathode contact 14 in step 124. If necessary, before the metallizations, a process step 123 is carried out for wafer thinning by back grinding.

Of course, modifications of such a manufacturing method may also be used. For example, p-conductive areas 20 and, in some cases, p-conductive areas 26 may also be produced by gas phase deposition. p-conductive areas 26 may also be produced before the trenches are etched.

Figure 3:
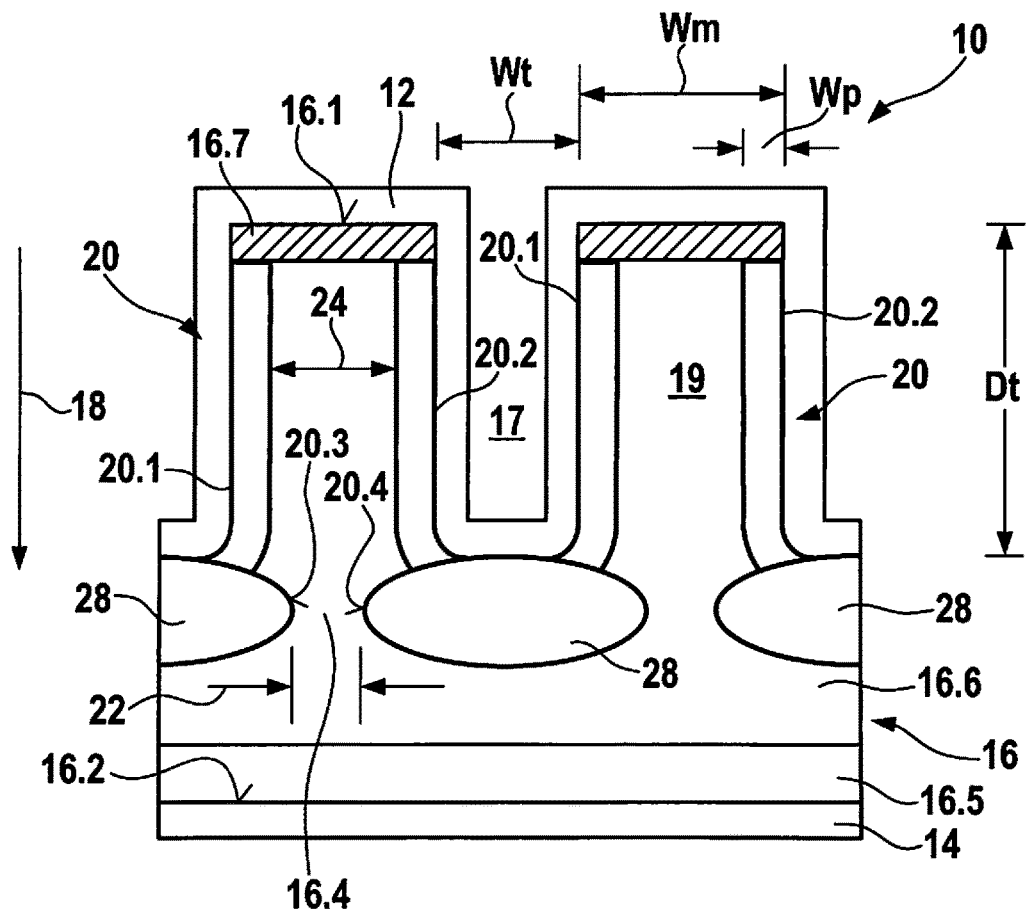
FIG. 3 schematically shows a second exemplary embodiment of a semiconductor system according to the present invention.

FIG. 3 shows an alternative semiconductor system 10 which manages entirely without the generation of a polycrystalline layer. Also in the case of the subject matter of FIG. 3, a sub-volume 16.6 is present in the form of an n-doped epi layer 16 on an n+-doped silicon substrate 16.5. Several trenches of a depth Dt, a width Wt and a distance Wm between the trenches are etched into sub-volume 16.6. Likewise, flat p-doped areas 20 of a wall thickness Wp are again present. They extend into n-doped sub-volume 16 or 16.6 from anode-side end 16.1 of sub-volume 16.6 in depth direction 18. Trenches 17 are separated from one another by mesa structures 19 extending between them. The anode-side surfaces of mesa structures 19 are covered by n+-doped sub-volumes 16.7 of first volume 16 of n-conductive material.

In contrast to the subject matter of FIG. 1, a highly p-doped area 28 is located on the cathode-side end of p-doped areas 20, the width of which, in a lateral direction being perpendicular to depth direction 18 and extending in the drawing plane, is greater than the width lying in this direction of a p-doped area 20, which is made up of two adjacent sub-areas 20.1, 20.2, which delimit the same trench. Highly p-doped area 28 thus protrudes in the lateral direction over the two adjacent sub-areas 20.1 and 20.2, which delimit a trench 17. Area 28 merges into p-conductive sub-areas 20.1, 20.2 without a pn junction and thus becomes a part of a p-doped area 20 and a p-doped sub-area 20.1 and a p-doped sub-area 20.2. The structure including a mesa 19 and an adjacent trench 17 is repeated in the lateral direction (pitch=Wt+Wm). As a result, a constriction having an opening width 16.4 is formed between two adjacent p-doped areas 28, through which the n-doped semiconductor material of mesa 19 having continuous n-conductivity, which lies between two adjacent trenches 17, merges into n-conductive sub-volume 16.6. Two p-doped areas 20.1, 20.2 each delimiting a mesa are connected on the anode side to a highly n+-doped sub-volume 16.7 of the n-conductive semiconductor material.

The entire chip front side as well as the trench sides and bottoms are completely covered by a planar, layer-like anode contact 12, so that anode contact 12 connects n-conductive sub-volumes 16.7 and p-conductive areas 20.1, 20.2 and 28 and forms an ohmic contact with at least n-doped sub-volumes 16.7 and p-doped area 28.

In one alternative embodiment, the metal of the anode contact completely fills trenches 17. A cathode contact 14 is again located on the rear side of the semiconductor system.

The mode of operation and the properties of the system according to FIG. 3 are largely consistent with the mode of operation and the properties of the subject matter of FIG. 1.

However, the exemplary embodiment according to FIG. 3 manages completely without a polycrystalline filling of trenches 17, which is often not entirely electrically perfect. In contrast to the subject matter of FIG. 1, in which a current flow takes place via filling 16.3 of the trenches produced after the etching of the trenches, the current flows in the subject matter of FIG. 3 via mesa structures 19 remaining during the etching of trenches 17.

Figure 4:
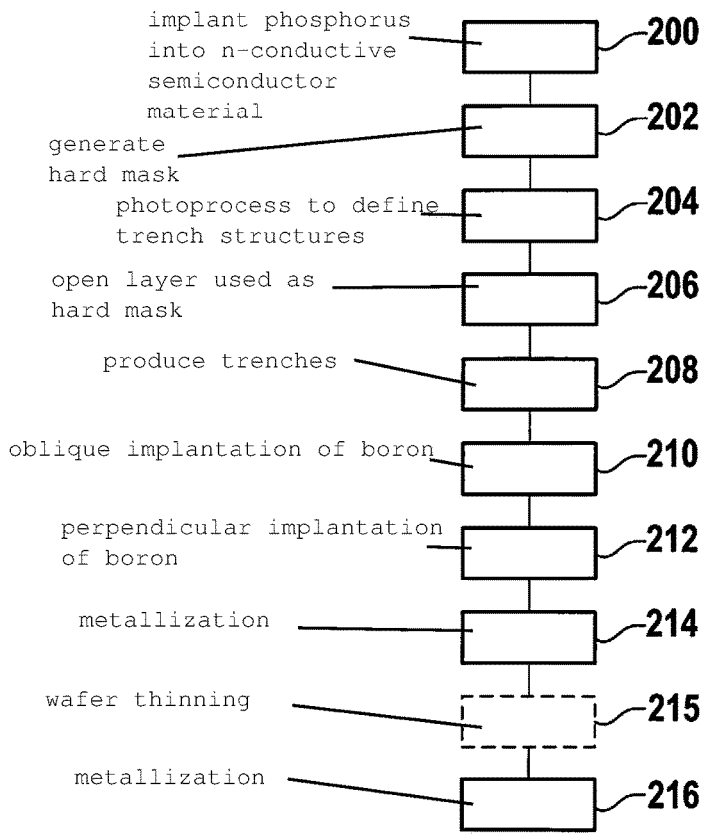
FIG. 4 schematically shows an exemplary embodiment of a method for manufacturing a semiconductor system according to FIG. 3.

FIG. 4 shows an exemplary embodiment of a method for manufacturing such a diode. A first volume 16 of semiconductor material of thickness Depi is also used as the base material here. In a step 200, highly n+-doped sub-volumes 16.7 are produced by implantation of phosphorus into the n-conductive semiconductor material. This is followed in step 202 by the generation of a hard mask, for example, of oxide or silicon nitride, and in a step 204, a photoprocess for defining the trench structures. Subsequently, the layer used as a hard mask is opened in a step 206. In a step 208, trenches of a depth Dt and a width Wt are produced in the n-conductive semiconductor material of sub-volume 16. The pitch is Wt+Wm. In a step 210, p-conductive sub-areas 20 are generated by an oblique implantation of boron into the trench walls and/or trench bottoms using a first dopant dose. In addition, in a step 212, a perpendicular implantation of boron into the trench bottoms is carried out to produce p-doped areas 28. The implantation dose used in this case is usually preferably higher than the dose used in the first implantation. The implantation is followed by a diffusion step 212 for electrically activating the implanted layers and for defining penetration depth Wp of p-doped areas 20, 20.1, 20.2 and distance 16.4 between more highly p-doped areas 28 and for activating n+-doped layer 16.7. Furthermore, in a step 214, anode contact 12 is produced by a metallization of the front side, and in a step 216, cathode contact 14 is produced by a metallization of the rear side of the semiconductor system. If necessary, before the metallizations, a process step 215 may be carried out for wafer thinning by back grinding. Again, alternative process sequences may also be used. Thus, the diffusion step may also be subdivided into multiple sub-steps.

Figure 5:
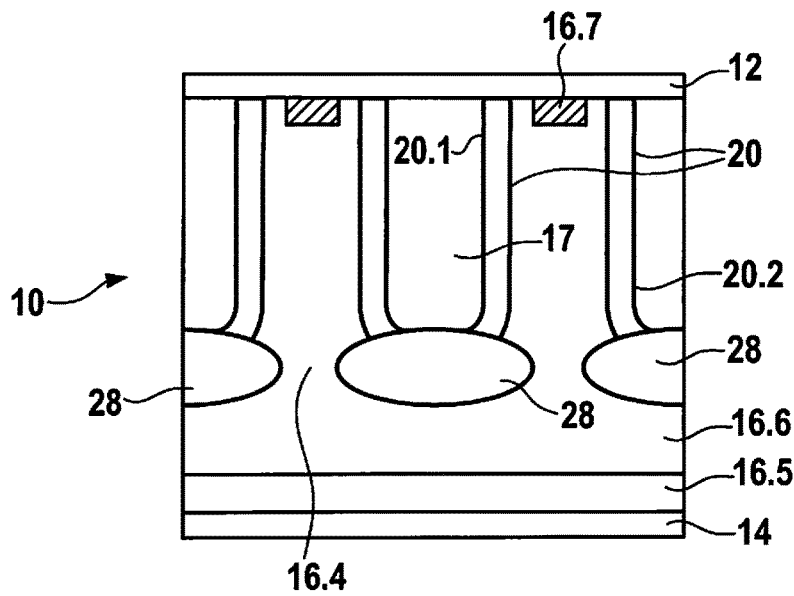
FIG. 5 schematically shows a third exemplary embodiment of a semiconductor system according to the present invention.

FIG. 5 shows an alternative system of the structure according to FIG. 3. Trenches 17 are filled with p-doped polysilicon, which establishes an ohmic contact with metallic anode contact 12 and an electrical connection to p-conductive areas 28 located in the trench bottoms. The requirements for the electrical quality of the preferably highly p-doped polysilicon areas 17, which are used for the electrical connection of anode contact 12 to p-conductive areas 28, are significantly lower than the requirements to be imposed on n-doped sub-volumes 16.3 in the first exemplary embodiment according to FIG. 1. The preferably highly p-doped polysilicon areas in trenches 17 of the exemplary embodiment according to FIG. 5 are therefore simpler to manufacture.

Figure 6:
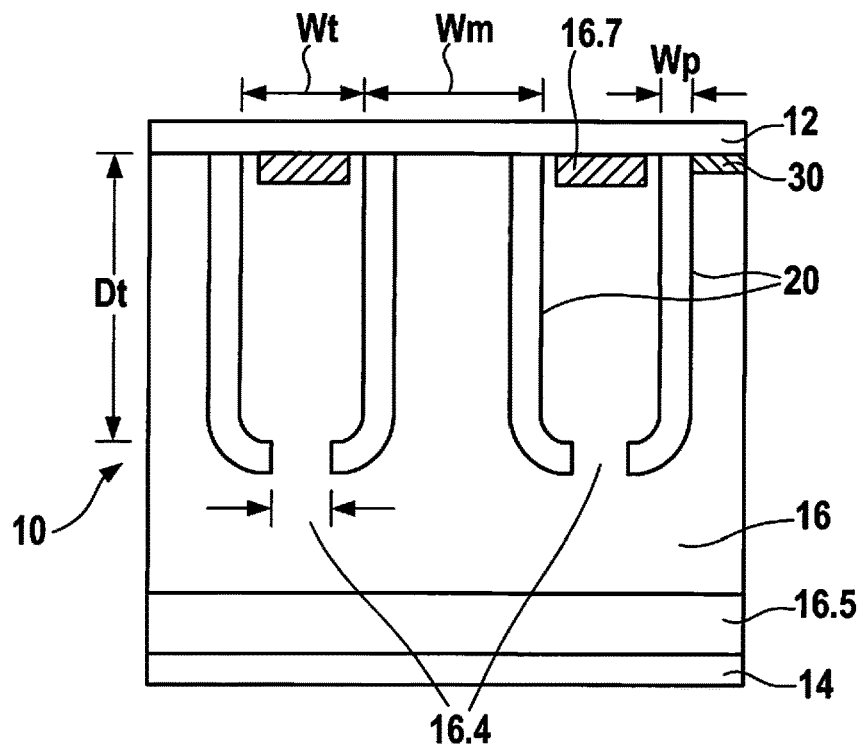
FIG. 6 schematically shows a fourth exemplary embodiment of a semiconductor system according to the present invention.

In the further system according to the present invention shown in FIG. 6, the PN junctions of the exemplary embodiment according to FIG. 1, which are formed in the case of the subject matter of FIG. 1 from p-doped layers 26 and n-doped epi-layer 16.6, are replaced by a Schottky contact. The Schottky contact is formed here by the metal of anode contact 12 and the n-conductive semiconductor material of volume 16. Instead of a simple metal, a silicide layer 30, for example, NiSi, extending between anode contact 12 and n-conductive semiconductor material 16, may preferably also be used as the metal of the Schottky contact. In this case, silicide layer 30 forms the Schottky junction with n-doped semiconductor material 16. The n-doped semiconductor material is, for example, silicon.

Since the forward voltage of a Schottky diode may be designed to be lower than that of a PN diode, the Schottky diode may take over part of the current flow at high currents and thus reduce the otherwise approximately linear rise of the voltage drop.

Figure 7:
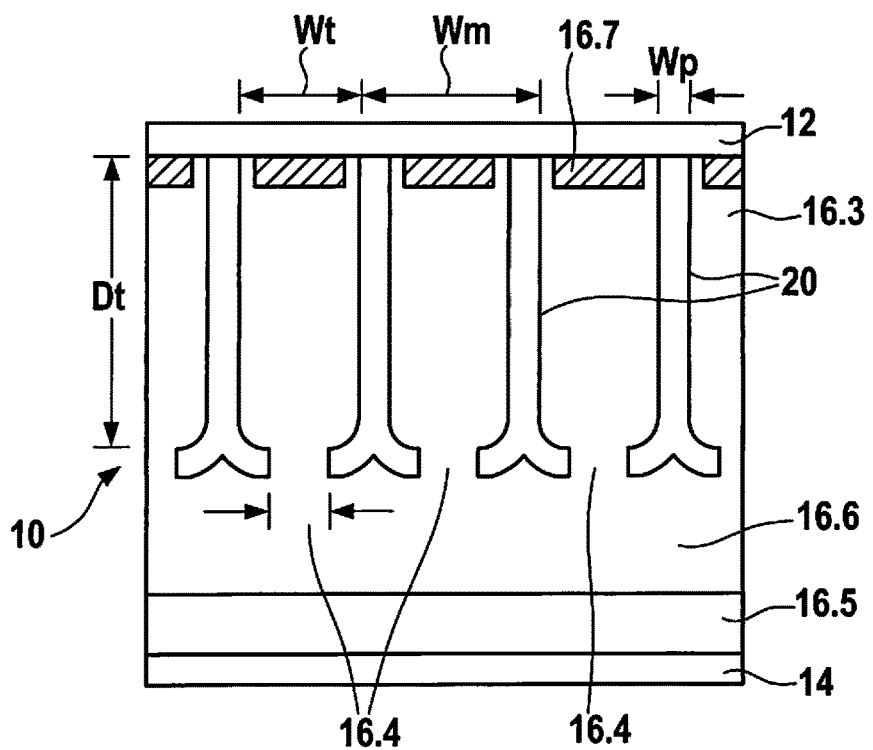
FIG. 7 schematically shows a fifth exemplary embodiment of a semiconductor system according to the present invention.

Finally, FIG. 7 shows a system which, in its design and function, is again similar to the system according to FIG. 1. However, the number of areas carrying current in the direction of flow is doubled because of the doubling of the number of openings 16.4. As a desirable result, the voltage drop in the direction of flow is halved. The manufacturing process is closely modeled on the manufacturing process of the first exemplary embodiment. If necessary, a p-doping of p-pillars 20 may also be carried out on their anode-side end in order to improve the ohmic contact of p-doped pillars 20 with the metal of anode contact 12.

What is claimed is:

1. A semiconductor system, comprising:
   a planar anode contact formed of metal;
   a planar cathode contact;
   a first volume of n-conductive semiconductor material which has an anode-side end and a cathode-side end and extends between the planar anode contact and the planar cathode contact, a direction pointing from the planar anode contact to the planar cathode contact defining a depth direction of the first volume; and
   at least one p-conductive area which extends from the anode-side end of the first volume in the depth direction toward the cathode-side end of the first volume without reaching the cathode-side end of the first volume, the p-conductive area having two sub-areas which are separated from one another in a cross section lying transversely with respect to the planar anode contact and the planar cathode contact, the two sub-areas delimit a first sub-volume of the first volume filled with n-conductive semiconductor material, the first sub-volume filled with the n-conductive semiconductor material extending through an opening toward the planar cathode contact, the opening being delimited by cathode-side ends of the two sub-areas, and a distance between the cathode-side ends of the two sub-areas defining the opening being smaller than a distance between the two sub-areas prevailing outside of the opening and lying between anode-side ends of the two sub-areas;
   wherein a highly p-doped area is located on the cathode-side end of the p-doped areas, a lateral width of the highly p-doped area being greater in a lateral direction than a width of two p-doped sub-areas adjacent to the highly p-doped area, a trench of the semiconductor system being between and delimited by the two p-doped sub-areas, so that the highly p-doped area protrudes in the lateral direction over the two p-doped sub-areas delimiting the trench, the trench having trench sides and a trench bottom, wherein the lateral direction is perpendicular to the depth direction;
   wherein the highly p-doped area is more highly p-doped than the two p-doped sub-areas;
   wherein the trench sides and the trench bottom are completely covered by and completely directly contact the planar anode contact, and the planar anode contact contacts the first sub-volume filled with the n-conductive semiconductor material, the at least one p-conductive area, and the highly p-doped area, forms an ohmic contact with at least the first sub-volume filled with the n-conductive semiconductor material and the highly p-doped area, and connects the n-conductive semiconductor material to the highly p-doped area in an electrically conductive manner.

2. The semiconductor system as recited in claim 1, further comprising:
   planar, p-doped areas, one of which connects a second sub-area of a first p-doped area having two sub-areas to a first sub-area of a second p-doped sub-area having two sub-areas adjacent to it.

3. The semiconductor system as recited in claim 1, wherein the first sub-volume is filled with the same n-conductive semiconductor material as the rest of the first volume.

4. The semiconductor system as recited in claim 1, wherein the first sub-volume is filled with n-conductive polycrystalline semiconductor material.

5. The semiconductor system as recited in claim 1, wherein the semiconductor material is silicon.

6. The semiconductor system as recited in claim 1, wherein the planar anode contact forms a Schottky contact with the anode-side end of the n-conductive semiconductor material.

7. The semiconductor system as recited in claim 6, wherein the metal of the Schottky contact is made of nickel or nickel silicide.

8. The semiconductor system as recited in claim 1, wherein all p-doped areas which are adjacent to one another have a minimum distance from one another on their cathode-side ends.

9. A semiconductor system, comprising:
- a planar anode contact;
- a planar cathode contact formed of metal;
- a first volume of p-conductive semiconductor material which has an anode-side end and a cathode-side end and extends between the planar cathode contact and the planar anode contact, a direction pointing from the planar cathode contact to the planar anode contact defining a depth direction of the first volume; and
- at least one n-conductive area which extends from the cathode-side end of the first volume in the depth direction toward the anode-side end of the first volume without reaching the anode-side end of the first volume, the n-conductive area having two sub-areas which are separated from one another in a cross section lying transversely with respect to the planar anode contact and the planar cathode contact, the two sub-areas delimit a first sub-volume of the first volume filled with p-conductive semiconductor material, the first sub-volume filled with the p -conductive semiconductor material extending through an opening toward the planar anode contact, the opening being delimited by anode-side ends of the two sub-areas, and a distance of the two sub-areas defining the opening being smaller than a distance between the two sub-areas prevailing outside of the opening and lying between anode-side ends of the two sub-areas;
- wherein a highly n-doped area is located on the anode-side end of the n-doped areas, a lateral width of the highly n-doped area being greater in a lateral direction than a width of two n-doped sub-areas adjacent to the highly n-doped area, a trench of the semiconductor system being between and delimited by the two n-doped sub-areas, so that the highly n-doped area protrudes in the lateral direction over the two adjacent sub-areas delimiting the trench, the trench having trench sides and a trench bottom, wherein the lateral direction is perpendicular to the depth direction;
- wherein the highly n-doped area is more highly n-doped than the two n-doped sub-areas;
- wherein the trench sides and the trench bottom are completely covered by and completely directly contact the planar cathode contact, and the planar cathode contact contacts the first sub-volume filled with the p-conductive semiconductor material, the at least one n-conductive area, and the highly n-doped area, and forms an ohmic contact with at least the first sub-volume filled with the p-conductive semiconductor material and the highly n-doped area, and connects the p-conductive semiconductor material to the highly n-doped sub-area in an electrically conductive manner.

\* \* \* \* \*